(12) United States Patent
Yang et al.

(10) Patent No.: US 10,269,868 B1
(45) Date of Patent: Apr. 23, 2019

(54) SEMICONDUCTOR STRUCTURE AND THE METHOD OF MAKING THE SAME

(71) Applicant: UNITED MICROELECTRONICS CORP., Hsin-Chu (TW)

(72) Inventors: Yu-Ru Yang, Hsinchu County (TW); Chih-Chien Liu, Taipei (TW); Chao-Ching Hsieh, Tainan (TW); Hsiao-Pang Chou, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/818,673

(22) Filed: Nov. 20, 2017

(30) Foreign Application Priority Data

Oct. 20, 2017 (CN) .......................... 2017 1 0998624

(51) Int. Cl.
*H01L 47/00* (2006.01)
*H01L 27/24* (2006.01)
*H01L 45/00* (2006.01)
*H01L 29/66* (2006.01)
*H01L 29/78* (2006.01)
*H01L 29/08* (2006.01)
*H01L 29/51* (2006.01)

(52) U.S. Cl.
CPC ...... *H01L 27/2436* (2013.01); *H01L 29/0847* (2013.01); *H01L 29/517* (2013.01); *H01L 29/66795* (2013.01); *H01L 29/7851* (2013.01); *H01L 45/085* (2013.01); *H01L 45/1233* (2013.01); *H01L 45/1253* (2013.01); *H01L 45/146* (2013.01); *H01L 45/1683* (2013.01)

(58) Field of Classification Search
CPC ............... H01L 29/0847; H01L 29/517; H01L 29/7851; H01L 45/085; H01L 45/1233
See application file for complete search history.

(56) References Cited

U.S. PATENT DOCUMENTS

| | | | |
|---|---|---|---|
| 9,023,699 B2 | 5/2015 | Chang | |
| 9,178,000 B1 | 11/2015 | Nardi | |
| 2013/0049068 A1* | 2/2013 | Lin | ..................... H01L 29/7853 257/192 |
| 2013/0094280 A1* | 4/2013 | Widjaja | .............. G11C 11/4072 365/148 |
| 2015/0144859 A1* | 5/2015 | Chen | ................... H01L 45/1253 257/4 |

\* cited by examiner

*Primary Examiner* — Samuel A Gebremariam
(74) *Attorney, Agent, or Firm* — Winston Hsu

(57) ABSTRACT

The present invention provides a semiconductor structure, the semiconductor structure includes a fin transistor (fin filed effect transistor, finFET) located on a substrate, the fin transistor includes a gate structure crossing over a fin structure, and at least one source/drain region. And a resistive random access memory (RRAM) includes a lower electrode, a resistance switching layer and a top electrode being sequentially located on the source/drain region and electrically connected to the fin transistor.

12 Claims, 4 Drawing Sheets

SEMICONDUCTOR STRUCTURE AND THE METHOD OF MAKING THE SAME

BACKGROUND OF THE INVENTION

1. Field of the Invention

Embodiments of the invention generally relate to a semiconductor structure, and more particularly, to a fin transistor (fin filed effect transistor, fin-FET) and a resistive random access memory (hereinafter abbreviated as RRAM) structure and the manufacturing method thereof.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The present invention provides a semiconductor structure, the semiconductor structure includes a fin transistor (fin filed effect transistor, fin-FET) located on a substrate, wherein the fin transistor comprising a gate structure crossing over a fin structure, and at least one source/drain region, and a resistive random access memory (RRAM) comprising a lower electrode, a resistive switching layer and an upper electrode sequentially located on the source/drain region and electrically connected to the fin transistor.

The present invention is characterized in that a fin transistor and a RRAM are combined with each other, and in particular, the RRAM is directly fabricated on the fin structure or on the epitaxial layer of the fin transistor, electrically connected to the source/drain regions of the fin transistor. Since the fin transistor has three-dimensional structure, the overall size of the semiconductor device can be reduced by integrating the RRAM and the fin transistor.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
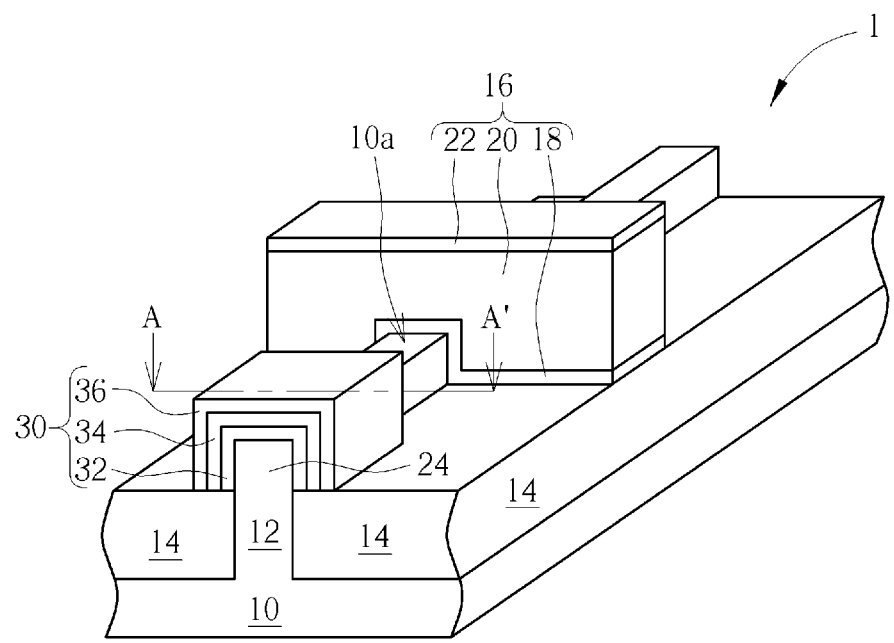
FIG. 1 illustrates the schematic diagram of a semiconductor structure according to the first preferred embodiment of the present invention.
Figure 2:
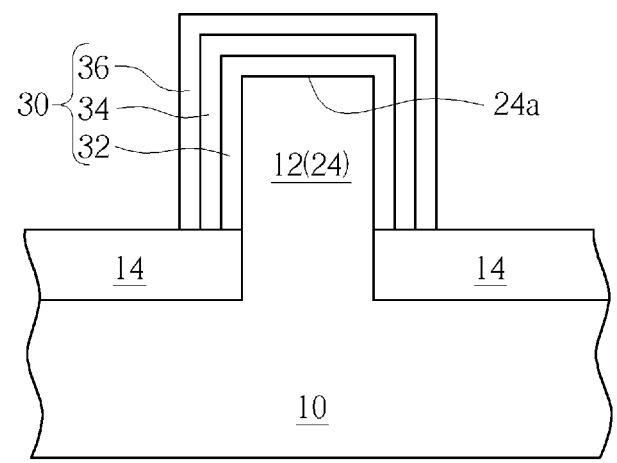
FIG. 2 is a schematic cross-section diagram along the cross-section line A-A' in FIG. 1.

FIG. 1 shows a schematic diagram of a semiconductor structure according to a first preferred embodiment of the present invention, FIG. 2 is a schematic cross-section diagram along the cross-section line A-A' in FIG. 1. As shown in FIG. 1. A semiconductor device having a substrate 10 and a plurality of fin structures 12 disposed thereon is provided. The main surface 10a of the substrate may have a specific orientation and the long axial direction of each fin structure 12 is aligned with a predetermined direction. For example, for a bulk silicon substrate, the main surface 10a of the substrate may have an orientation (100) and the long axial direction of each fin structure 12 is aligned with a direction (110), but not limited thereto. In addition to the bulk silicon substrate, the substrate 10 may be chosen from another semiconductor substrate such as a silicon containing substrate, a III-V semiconductor-on-silicon (such as GaAs-on-silicon) substrate, a graphene-on-silicon substrate, a silicon-on-insulator (SOI) substrate, a silicon dioxide substrate, an aluminum oxide substrate, a sapphire substrate, a germanium containing substrate or an alloy of silicon and germanium substrate.

More precisely, the method for fabricating the fin structures 12 may include the following processes, but not limited thereto. First, a bulk substrate (not shown) is provided and a hard mask layer (not shown) is formed thereon. The hard mask layer is then patterned through a photolithographic and an etching process, so as to define the location for forming fin structures 12 in the bulk substrate. Afterwards, an etching process is performed to form fin structures 12 in the bulk substrate. After the above processes, the fabrication method for the fin structures 12 is complete. In this case, the fin structures 12 may be regarded as protruding from the surface 10a of the substrate 10 and the compositions of the fin structures 12 and the substrate 10 may be the same, such as monocrystalline silicon. In another case, when the substrate is chosen from a III-V semiconductor-on-silicon substrate rather than the above-mentioned bulk silicon substrate, the main compositions of the fin-shaped structures may be the same as that of the III-V semiconductor and differ from that of the underlying substrate.

In this embodiment, an insulating layer 14 is disposed between every two adjacent fin structures 12, such as a shallow trench isolation (STI), which can be formed through a STI process or others suitable processes, it is a well-known technology and will not be redundantly described here.

Next, a gate structure 16 is formed on the substrate 10, to cross over the fin structure 12 and partially covering the fin structure 12. The method of forming the gate structure 16 may include the following steps: firstly, forming a gate dielectric material layer (not shown), a gate conductive material layer (not shown) and a cap material layer (not shown) sequentially. Then, a patterned photoresist or a patterned mask is used for a protection layer, an etching step is performed to pattern the gate dielectric material layer, the gate conductive material layer and the cap material layer to form a gate structure 16. The gate structure 16 includes a gate dielectric layer 18, a gate conductive layer 20, and a cap layer 22. The patterned photoresist or the patterned mask is then removed. The material of the gate dielectric layer 18 may include silicon oxide (SiO), silicon nitride (SiN), silicon oxynitride (SiON), or a dielectric material having a dielectric constant (k value) larger than 4, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_1-xO_3$, PZT), barium strontium titanate ($BaxSr_1-xTiO_3$, BST) or a combination thereof. The material of the gate conductive layer 20 may include undoped polysilicon, heavily doped polysilicon, or one or a plurality of metal layers such as a work function metal layer, a barrier layer and a low-resistance metal layer, etc. The cap layer 22 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In addition, the present invention may further include a spacer (not shown) on both sides of the gate structure. For the sake of simplicity, the spacer is not shown in FIG. 1.

In this embodiment, the gate dielectric layer 18 of the gate structure 16 is made of silicon oxide, the gate conductive layer 20 is made of doped polysilicon, and the cap layer 22 includes a stacking structure having a silicon nitride layer and a silicon oxide layer, but not limited thereto. The present invention may also combine with different kinds of metal gate processes such as gate-first process, high-k first process and gate-last process. In addition, the current gate structure 16 is made of polysilicon, and the polysilicon layer can also be replaced by a metal layer by a subsequent replacement metal gate (RMG) process.

In addition, the source/drain regions 24 are formed by ion doping process in the fin structure 12 not covered by the gate structure 16. In other embodiments, a portion of the fin structure 12 is firstly removed, an epitaxial layer (not shown) is formed by an epitaxial process or the like, used as the source/drain regions of the fin transistor. In this embodiment, the ions are directly doped into parts of fin structure 12, so the source/drain region 24 of the fin structure 12 has a flat top surface 24a. The fin structure 12, the gate structure 16 and the source/drain regions 24 constitute a fin transistor 1.

The present invention is characterized in that a resistive random access memory (RRAM) 30 is formed, and electrically connected to a source/drain region 24 of the fin transistor 1, as shown in FIG. 1 and FIG. 2. Since the fin transistor 1 has a three-dimensional structure, the combination of the RRAM and the fin transistor can achieve the purpose of reducing the area of the element. In the first embodiment of the present invention, the RRAM 30 includes a lower electrode layer 32, a resistance switching layer 34 and an upper electrode layer 36. The material of the lower electrode layer 32 and the upper electrode layer 36 is, for example, titanium nitride (TiN), tantalum nitride (TaN), tungsten nitride (WN), or the like. In some embodiments, the lower electrode layer 32 or the upper electrode layer 36 is doped polysilicon, such as P+ doped polysilicon or N+ doped polysilicon. In addition, the material of the lower electrode layer 32 and the upper electrode layer 36 may be the same or different, and the present invention is not limited thereto. The material of the resistance switching layer 34 includes transition metal oxide. The materials that can be used as the resistance switching layer 34 include titanium oxide (TiO), nickel oxide (NiO), tungsten oxide ($WO_3$), zirconium oxide (ZrO), copper oxide (CuO), hafnium oxide (HfO), tantalum oxide (TaO), zinc oxide (ZnO), aluminum oxide ($Al_2O_3$), molybdenum oxide (MoO), and the like, but are not limited thereto. In most embodiments, the thickness of the resistance switching layer 34 is between 20 angstroms to 100 angstroms. In some embodiments, the thickness of the resistance switching layer 34 is from 30 angstroms to 70 angstroms, such as 50 angstroms. It should be noted that the material of the resistance switching layer 34 can be the same as that of the gate dielectric layer 18 of the gate structure 16. That is, during the manufacturing process, the gate dielectric layer 18 and the resistance switching layer 34 can be made in the same process to save process steps. However, the present invention is not limited thereto.

In addition, in some embodiments, since the source/drain region 24 is conductive, the source/drain region 24 may be used instead of the lower electrode of the RRAM 30. In other words, the lower electrode layer 32 of the RRAM 30 may be omitted. It should also be within the scope of the present invention.

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
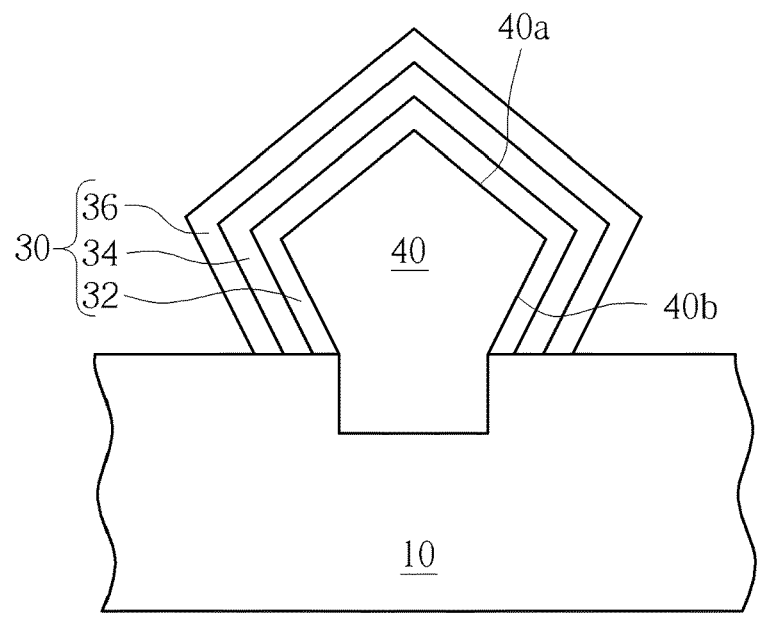
FIG. 3 illustrates the schematic diagram of a semiconductor structure according to the second preferred embodiment of the present invention.

Please refer to FIG. 3, which illustrates a cross-sectional view of a semiconductor structure according to a second preferred embodiment of the present invention. In this embodiment, a fin transistor and a RRAM are also formed. The difference between this embodiment and the embodiment mentioned above is that in this embodiment, part of the fin structure is replaced by an epitaxial layer, and the epitaxial layer is used as the source/drain region of the fin transistor. More precisely, as shown in FIG. 2, after the gate structure is completed, a portion of the fin structures not covered by the gate structure is removed to form recesses on both sides of the gate structure, and then an epitaxial process is performed, to form an epitaxial layer 40 in each recess.

According to different embodiments, the epitaxial layer 40 may comprise a silicon germanium epitaxial layer, which is used for a PMOS transistor, or the epitaxial layer 40 may comprise a silicon carbon epitaxial layer, which used for an NMOS transistor. An ion implantation process is then performed to implant the appropriate ions, or the implantation process may be performed during the epitaxial process. Thus, the epitaxial layer 40 can be used as a source/drain region. After the epitaxial layer 40 is formed, a silicide process (or a salicide process, not shown) may be performed to form silicide in the source/drain region, the silicide process may include a pre-clean process, a metal depositing process, an annealing process, a selective etching process, or a test process, etc.

The epitaxial layer 40 will grow along the lattice plane, and may have a polygonal cross-sectional structure. For example, the epitaxial layer 40 in this embodiment includes an upper inclined surface 40a and a lower inclined surface 40b. The upper inclined surface 40a is disposed along the [111] plane, and the lower inclined surface 40b is also disposed along the [111] plane. After the epitaxial layer 40 is formed, the RRAM 30 is formed on the epitaxial layer 40. In this embodiment, the RRAM 30 is formed along the surface of the epitaxial layer 40. The RRAM 30 also includes the lower electrode layer 32, the resistance switching layer 34 and the upper electrode layer 36. The material of each material layer is the same as that described in the first preferred embodiment, which will not be redundantly described herein.

Figure 4:
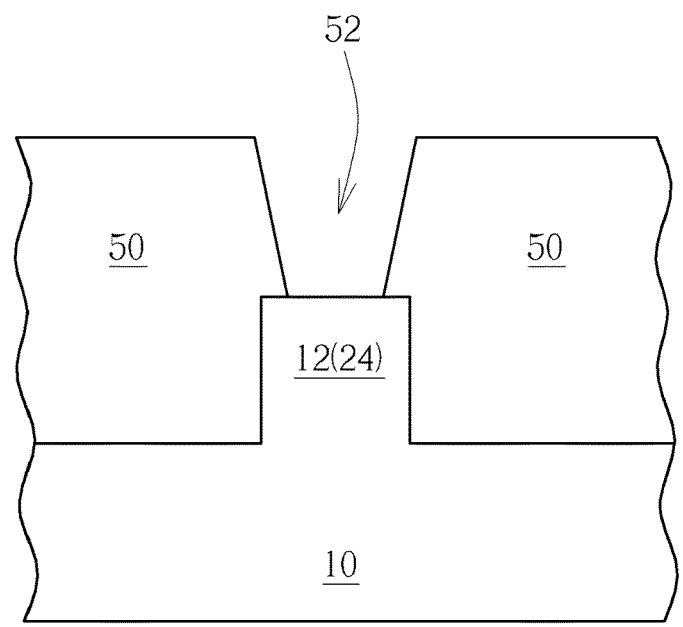
FIG. 4 and FIG. 5 illustrate the schematic diagrams of a semiconductor structure according to the third preferred embodiment of the present invention.
Figure 5:
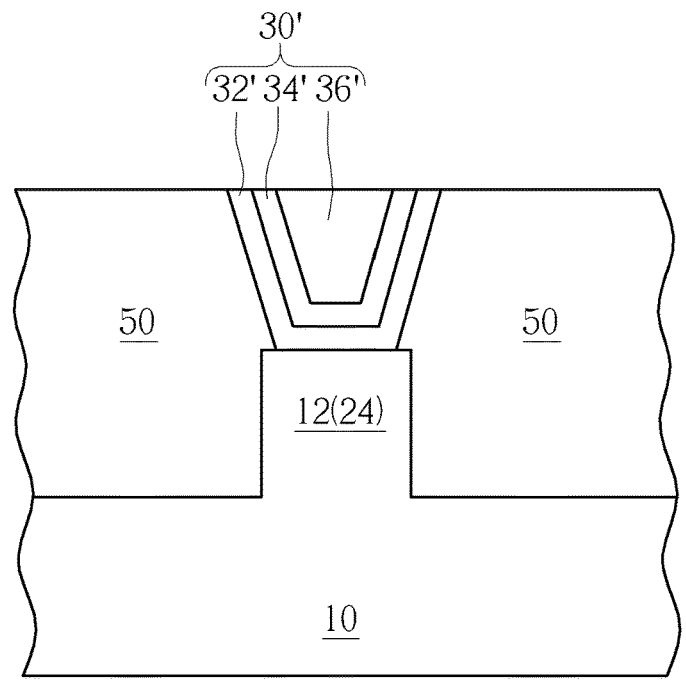

Please refer to FIG. 4 and FIG. 5, which illustrate the cross-sectional views of the semiconductor structure of the third preferred embodiment of the present invention. In this embodiment, the fin structure 12 is remained to use as the source/drain region 24 of the fin transistor. However, after the source/drain region 24 is completed, as shown in FIG. 4, a dielectric layer 50 is formed to cover the fin transistor, and then a contact hole 52 is formed in the dielectric layer 50, to expose a portion of the source/drain region 24. Next, as shown in FIG. 5, a lower electrode layer 32', a resistance switching layer 34' and an upper electrode layer 36' are sequentially formed in the contact hole 52. The lower electrode layer 32', the resistance switching layer 34' and the upper electrode layer 36' constitute a RRAM 30'. In other words, the RRAM 30' in the present embodiment is formed in the contact hole 52. Regarding the material of the lower electrode layer 32', the material of the resistance switching layer 34' and the material of the upper electrode layer 36' are the same as that of the lower electrode layer 32, the resistance switching layer 34 and the upper electrode layer 36 described in the above first preferred embodiment respectively, and it will not be described again here.

Figure 6:
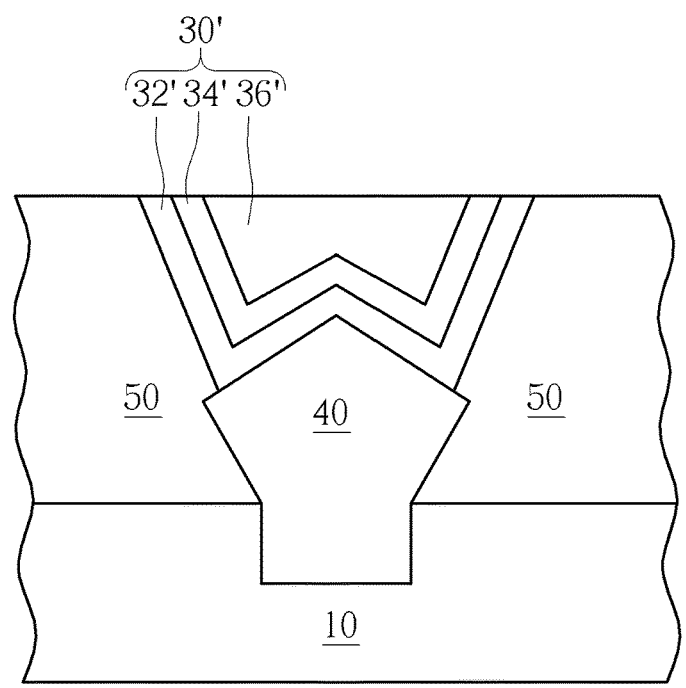
FIG. 6 illustrates the schematic diagram of a semiconductor structure according to the fourth preferred embodiment of the present invention.

Please refer to FIG. 6, which illustrates a cross-sectional view of a semiconductor structure of a fourth preferred embodiment of the present invention. This embodiment is similar to the above mentioned third preferred embodiment, the RRAM is also formed in the contact hole. The difference between this embodiment and the above third preferred embodiment is that a portion of the fin structure is replaced by the epitaxial layer 40, and the epitaxial layer 40 is used as the source/drain regions of the fin transistor. The contact hole exposes the epitaxial layer 40, and then the RRAM 30' is then formed in the contact hole, the epitaxial layer 40 has a non-planar top surface, and the RRAM 30' directly contacts the non-planar top surface of the epitaxial layer 40. The other features are the same as those in the other embodiments described above, which will not be repeated here.

Figure 7:
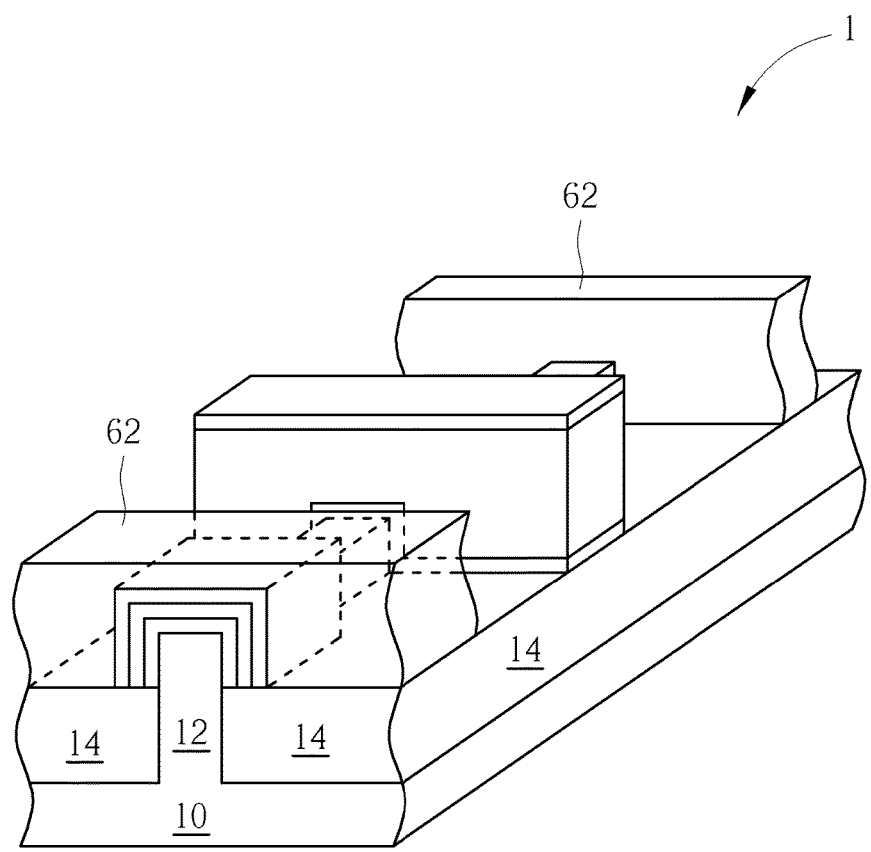
FIG. 7 illustrates the schematic diagram of a semiconductor structure of the first preferred embodiment of the present invention connecting to slot contact structures.

In subsequent steps, a contact structure, such as a pole contact structure or a slot contact structure, may be formed to electrically connect the RRAM and the fin transistor. FIG. 7 is a schematic diagram of the semiconductor structure connecting a slot contact structure according to the first preferred embodiment of the present invention. As shown in FIG. 7, after the RRAM and the fin transistor are completed (refer to FIG. 1), slot contact structures 62 are formed to cross the RRAM 30 and a portion of the fin structure 12. Besides, the slot contact structure 62 may further cross other fin structure (not shown) adjacent to the fin structure 12. In addition, in other embodiments, a pole contact structure may be used to replace the slot contact to electrically connect the RRAM or the fin transistor.

The present invention is characterized in that a fin transistor and a RRAM are combined with each other, and in particular, the RRAM is directly fabricated on the fin structure or on the epitaxial layer of the fin transistor, electrically connected to the source/drain regions of the fin transistor. Since the fin transistor has three-dimensional structure, the overall size of the semiconductor device can be reduced by integrating the RRAM and the fin transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a fin transistor (fin filed effect transistor, fin-FET) located on a substrate, wherein the fin transistor comprising a gate structure crossing over a fin structure, and at least one source/drain region; and
   a resistive random access memory (RRAM) comprising a lower electrode, a resistive switching layer and an upper electrode sequentially located on the source/drain region and electrically connected to the fin transistor, wherein the lower electrode of the RRAM contacts a top surface and two sidewalls of the fin structure directly.

2. The semiconductor structure of claim 1, wherein the source/drain region has a flat top surface.

3. The semiconductor structure of claim 1, wherein the fin structure comprises an epitaxial region, the source/drain region is located in the epitaxial region, and the resistive random access memory crosses over the epitaxial region.

4. The semiconductor structure of claim 3, wherein the resistive random access memory directly contacts a portion of the epitaxial region.

5. The semiconductor structure of claim 3, wherein the epitaxial region has a non-planar top surface.

6. The semiconductor structure of claim 3, wherein the epitaxial region has at least one upper inclined surface on the [111] plane, and at least one lower inclined surface on the [111] plane.

7. The semiconductor structure of claim 3, wherein the epitaxial region has a polygonal cross-sectional structure.

8. The semiconductor structure of claim 1, further comprising a dielectric layer disposed on the substrate, and the dielectric layer includes a contact hole disposed therein, the contact hole exposes a portion of the fin structure.

9. The semiconductor structure of claim 8, wherein the resistive random access memory is located in the contact hole.

10. The semiconductor structure of claim 8, wherein the fin structure comprises an epitaxial region, and the contact hole exposes a portion of the epitaxial region.

11. The semiconductor structure of claim 10, wherein the resistive random access memory is located in the contact hole.

12. The semiconductor structure of claim 1, wherein the resistive random access memory directly contacts the source/drain region.

* * * * *